United States Patent
Pfeifer et al.

(10) Patent No.: US 9,644,732 B2
(45) Date of Patent: May 9, 2017

(54) SENSOR DEVICE, AND A MAGNET ELEMENT FOR A SENSOR DEVICE

(71) Applicant: ZF FRIEDRICHSHAFEN AG, Friedrichshafen (DE)

(72) Inventors: Ralf Pfeifer, Diepholz (DE); Andreas Peukert, Barnstorf (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 259 days.

(21) Appl. No.: 14/362,455

(22) PCT Filed: Nov. 15, 2012

(86) PCT No.: PCT/EP2012/072666
§ 371 (c)(1),
(2) Date: Jun. 3, 2014

(87) PCT Pub. No.: WO2013/087336
PCT Pub. Date: Jun. 20, 2013

(65) Prior Publication Data
US 2014/0345408 A1 Nov. 27, 2014

(30) Foreign Application Priority Data

Dec. 13, 2011 (DE) .................. 10 2011 088 365

(51) Int. Cl.
*G01R 33/06* (2006.01)
*F16H 59/02* (2006.01)
(Continued)

(52) U.S. Cl.
CPC ........... *F16H 59/02* (2013.01); *F16H 59/105* (2013.01); *G01D 5/145* (2013.01);
(Continued)

(58) Field of Classification Search
CPC ............ G01R 33/0035; G01R 33/0094; G01R 33/072; G01R 35/005; G01N 33/557
(Continued)

(56) References Cited

U.S. PATENT DOCUMENTS 5,519,393 A * 5/1996 Brandestini .......... G01D 5/2492
341/10
5,880,683 A 3/1999 Brandestini
(Continued)

FOREIGN PATENT DOCUMENTS

DE 14 38 899 6/1969
EP 0 212 628 3/1987
(Continued)

OTHER PUBLICATIONS

International Search Report issued Mar. 26, 2013 in International Application No. PCT/EP2012/072666.
(Continued)

*Primary Examiner* — Melissa Koval
*Assistant Examiner* — Trung Nguyen
(74) *Attorney, Agent, or Firm* — Brinks Gilson & Lione

(57) ABSTRACT

A sensor device having at least one sensor element, such as a Hall sensor element, and at least one magnet element that can move in relation to the sensor element. The sensor element has a number of differently magnetized regions. The sensor element is configured to issue a sensor signal, which represents a condition defined by a magnetization of a region of the magnet element located in the measurement range of the sensor element. The sensor element determines the condition by means of one of at least three pre-defined sensor signal values.

12 Claims, 5 Drawing Sheets

(51) Int. Cl.
  *G01D 5/14* (2006.01)
  *G01R 33/00* (2006.01)
  *G01R 33/07* (2006.01)
  *H01F 7/02* (2006.01)
  *F16H 59/10* (2006.01)

(52) U.S. Cl.
  CPC ....... *G01R 33/0094* (2013.01); *G01R 33/072* (2013.01); *H01F 7/021* (2013.01); *B62K 2207/00* (2013.01); *Y10T 74/20018* (2015.01)

(58) Field of Classification Search
  USPC ......... 324/207.02, 200, 207.11–207.26, 220, 324/219, 500, 559, 76.11, 304
  See application file for complete search history.

(56) References Cited

U.S. PATENT DOCUMENTS

| | | |
|---|---|---|
| 5,880,913 A | 3/1999 | Gill |
| 6,404,188 B1 | 6/2002 | Ricks |
| 8,692,546 B2 * | 4/2014 | Cesaretti ................ 324/202 |
| 2009/0125024 A1 * | 5/2009 | Baur .............. A61B 17/1626 606/42 |
| 2013/0063133 A1 * | 3/2013 | Iwata ................ F16H 59/105 324/207.2 |

FOREIGN PATENT DOCUMENTS

| | | |
|---|---|---|
| EP | 1 942 317 | 7/2008 |
| JP | 61 133819 | 6/1986 |

OTHER PUBLICATIONS

International Search Report and Written Opinion from corresponding International Patent Application PCT/EP2012/072666, dated Mar. 26, 2013 (German Language).

German Office Action for DE 10 2011 088 365.7, dated Jul. 11, 2013 (German Language), including translation of p. 5.

* cited by examiner

|   | 1 | 2 | 3 | 4 | 5 | 6 | 7 | 8 |
|---|---|---|---|---|---|---|---|---|
| A | 0000 | 0011 | 0101 | 0110 | 1001 | 1010 | 1100 | 1111 |
| B | 0001 | 0010 | 0100 | 0111 | 1000 | 1011 | 1101 | 1110 |

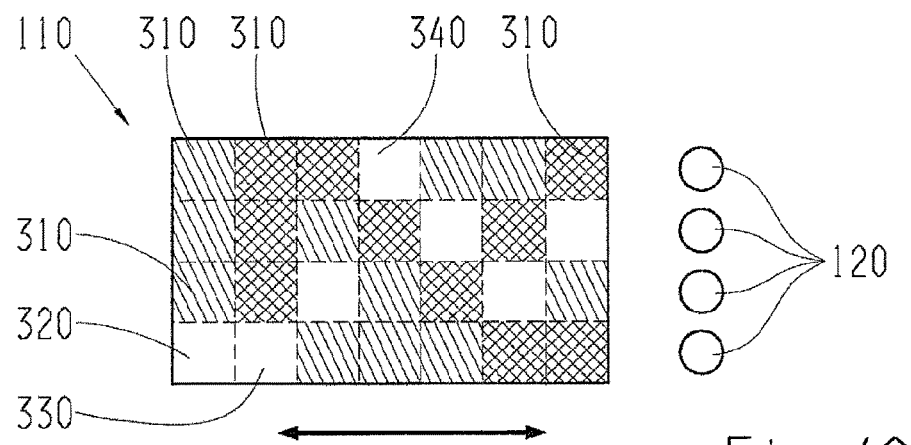
Fig. 4A
Fig. 4B
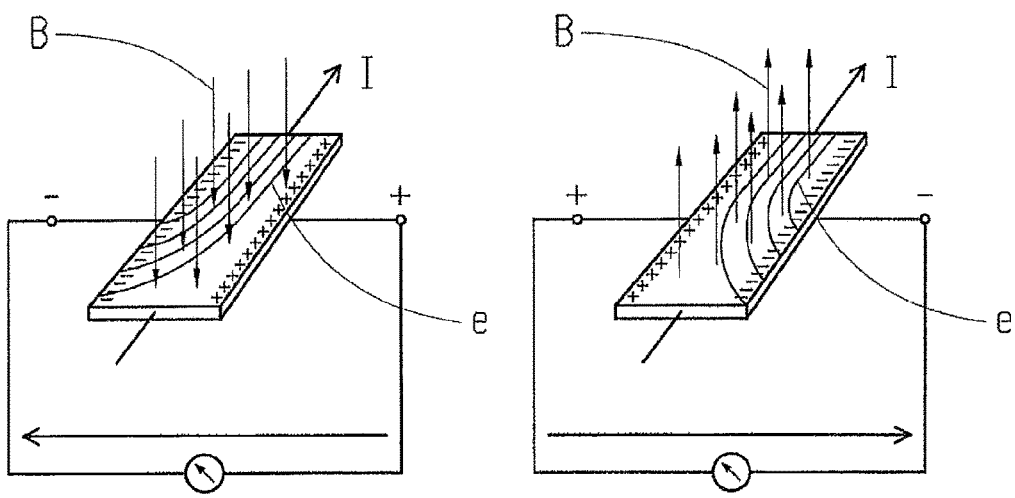
Fig. 5A
Fig. 5B

| $h_{min}=3$ | 0000 | 0111 | 0222 | 1012 | 1120 | 1201 | 2021 | 2102 | 2210 |
|---|---|---|---|---|---|---|---|---|---|
| 0000 | – | 3 | 3 | 3 | 3 | 3 | 3 | 3 | 3 |
| 0111 | 3 | – | 3 | 3 | 3 | 3 | 3 | 3 | 3 |
| 0222 | 3 | 3 | – | 3 | 3 | 3 | 3 | 3 | 3 |
| 1012 | 3 | 3 | 3 | – | 3 | 3 | 3 | 3 | 3 |
| 1120 | 3 | 3 | 3 | 3 | – | 3 | 3 | 3 | 3 |
| 1201 | 3 | 3 | 3 | 3 | 3 | – | 3 | 3 | 3 |
| 2021 | 3 | 3 | 3 | 3 | 3 | 3 | – | 3 | 3 |
| 2102 | 3 | 3 | 3 | 3 | 3 | 3 | 3 | – | 3 |
| 2210 | 3 | 3 | 3 | 3 | 3 | 3 | 3 | 3 | – |

Fig. 6

| A | $d_{min}$ | $K_b$ | $A_b$ | $K_t$ | $A_t$ |
|---|---|---|---|---|---|
| 4 | 2 | 8 | 2 | 27 | 28 |
| 4 | 3 | 2 | 38 | 9 | 72 |
| 4 | 4 | 2 | 8 | 3 | 216 |
| 5 | 4 | 2 | 94 | 6 | 7776 |
| 5 | 5 | 2 | 16 | 3 | 1296 |

Fig. 7

| n | 3 | 4 | 5 | 6 | 7 | 8 | 9 | 10 |
|---|---|---|---|---|---|---|---|---|
| K | 2 | 3 | 4 | 4 | 5 | 6 | 6 | 7 |

Fig. 8

SENSOR DEVICE, AND A MAGNET ELEMENT FOR A SENSOR DEVICE

This application is a filing under 35 U.S.C. §371 of International Patent Application PCT/EP2012/072666, filed Nov. 15, 2012, and claims the priority of DE 10 2011 088 365.7, filed Dec. 13, 2011. These applications are incorporated by reference herein in their entirety.

The present invention relates to a sensor device, a method for the detection of a position of the magnet element in relation to a sensor element, and a magnet element for a sensor device of this type according to the independent claims.

Figures 1, 2:
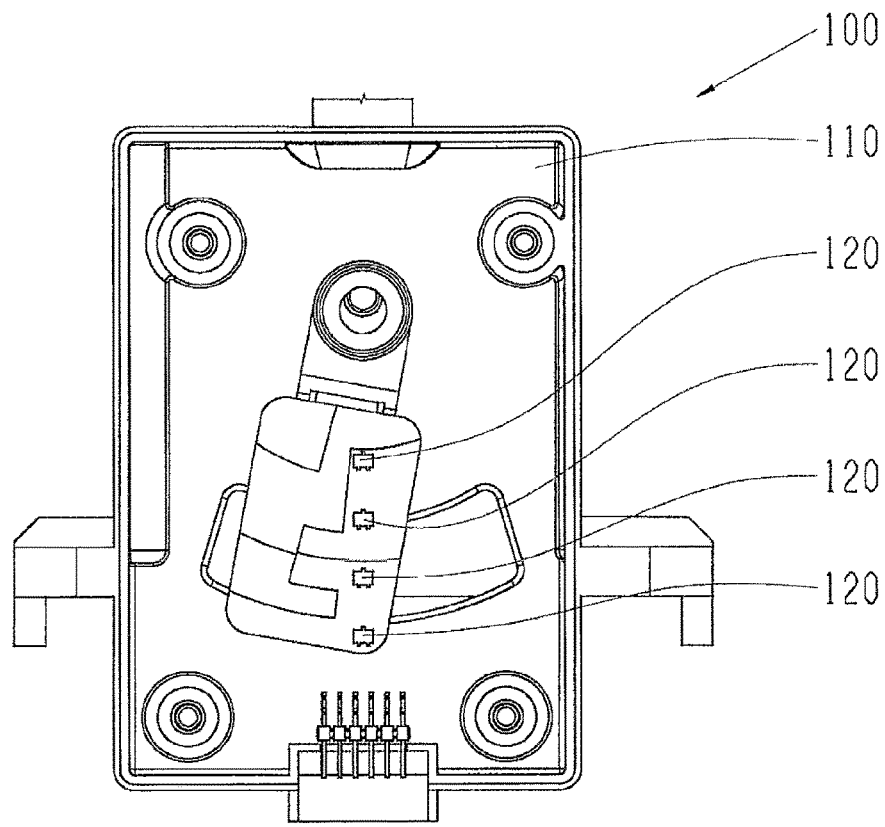

Currently, a magnet plate is used in some applications for gear selector levers, which is moved by the selector lever, and the position of which is detected by Hall sensors, as is shown in FIG. 1 as an example of a shift lever sensor assembly 100, which has a magnet plate 110 for evaluating the position of the shift lever, the magnetic regions of which are read out by numerous sensors 120, which are, in particular, designed as Hall sensors. The Hall sensors 120 and a downstream evaluation logic identify one direction of the magnetic field as "1" and the other as "0" thereby, thus, each sensor can issue two values (i.e. they function as binary sensors), and these values, "0" and "1" are referred to as an alphabet in coding theory. The exemplary analysis of the present product, such as the assembly reproduced in FIG. 1, for example, shows, in an overview illustration and a detail illustration, that with four sensors, $2^4=16$ different states can each be depicted as a 4-bit word. For the depiction of the different shift lever positions, only 6 code words are required, (P R N D+ −; P=park, R=reverse, N=neutral, D=drive=the driving position of the lever, +=the shift lever position for effecting a shifting to a higher gear, −=shift lever position for effecting a shifting to a lower gear) however, theoretically, three sensors would also be sufficient here.

In order to detect a bit error, special properties of these code words are required, which, in particular, enable a measurement of the Hamming distance. If, for example, a minimal Hamming distance of two is required, then each code word used for the output should differ from each of the other valid code words in at least two characters. When applied to the example in FIG. 1, one could require a minimal Hamming distance of three. However, no more than two code words can be found among the 16 possible code words that fulfill this condition. Because, however, six code words are required for the output of P, R, N, D, +, −, the shown sensor group cannot output the gear selection with a Hamming distance of ≥3. If the requirement is reduced to a minimal Hamming distance of two, then up to eight different code words can be formed. The table in FIG. 2 shows the two possible solutions, A or B, with which each code word has at least the Hamming distance of two to each of the other code words in its (encoding) pattern, 1-8.

EP 1 003 186 A1 discloses a method, a selection lever and selection device for ensuring a position detection of a position assumed by the selection lever.

With this background, the present invention provides an improved sensor device, an improved method for detecting a position of the magnet element in relation to a sensor element, and an improved magnet element for a sensor device according to the independent claims. Advantageous designs can be derived from the dependent claims and the following description.

The present invention provides a sensor device having at least one sensor element, in particular a Hall sensor element, and at least one magnet element that can move in relation to the sensor element, which has a plurality of differently magnetized regions, characterized in that the sensor element is designed to be able to issue a sensor signal that represents a state with respect to a magnetization of a region of the magnet element located in the measurement range of the sensor element by means of one of at least three pre-defined sensor signal values.

The present invention further provides a method for detecting a position of the magnet element in relation to a sensor element, wherein the method uses a sensor device, described above, characterized by the following steps:

issuing a sensor signal, which represents a state with respect to a magnetization of a region of the magnet element located in the measurement range of the sensor element by means of one of at least three pre-defined sensor signal values.

Furthermore, the present invention provides a magnet element for a sensor device, wherein the magnet element comprises a plurality of magnetized regions and at least one non-magnetized and/or diamagnetic region, adjacent to at least two magnetized regions. Preferably, the non-magnetized region and/or diamagnetic region is disposed at least adjacent to, more preferably, between two identically magnetized regions, and/or between two differently magnetized regions.

A sensor element can, in particular, be understood to be a sensor, which is designed for detecting magnetic values. By way of example, the sensor can be a Hall sensor. A magnet element can be understood to be an element that has different magnetized regions. By way of example, the magnet element can be a disk, containing different magnetized regions in its body. Alternatively, the magnet element can also have a carrier plate, onto which individual magnets are attached. The magnet element, however, should be able to move in relation to the sensor element, in order to be able to detect a change in position of the magnet element (which, for example, is connected to a shift lever for a vehicle transmission) in relation to the sensor element. A sensor signal can be understood to be an output signal of the sensor element, which exhibits a datum regarding a state of the magnetization of the magnet element in a region lying in the measurement range of the sensor element. A state with respect to a magnetization can be understood to be the presence of a magnetization (in particular the orientation of a magnetic field), or no magnetization in the region of the magnet element lying in the measurement range of the sensor element. A pre-defined sensor signal value can be understood to be a value from a pre-defined quantity of sensor signal values. In particular, the sensor signal values can assume at least three discreet values, which represent, for example, the presence of a magnetic field in a first direction, a second direction differing from the first direction, or the absence of a magnetic field, in the region of the magnet element in the measurement range of the sensor element.

The present invention is based on the realization that, by using sensor signals having signal values, which are selected from at least three sensor signal values, very precise conclusions can be obtained regarding the presence of a state with respect to a magnetization of a region of the magnet element in the measuring range of the sensor element. In particular, by this means it is possible to make a detailed statement regarding the concrete state of the magnet element in the measurement range of the sensor element using a single sensor. With respect to solutions in the prior art, in which sensors having binary sensor signal values are used, an increase in the measurement precision, with only a small additional cost, can be obtained by means of introducing an additional sensor signal value, in particular, a value that represents the absence of magnetization of the magnet element in the measurement range of the sensor. In addition, an evaluation of sensor signals of this type can also be improved, because, for example, with the combination of sensor signals from numerous sensor devices of this type, to form sensor signal words, a greater Hamming spacing between individual sensor signal words can be implemented than in the case in which sensors with binary output values are used.

An embodiment of the present invention is particularly beneficial, in which the sensor element is designed to be able to provide a pre-defined sensor signal value as a sensor signal, when, in one state with respect to a magnetization of the region of the magnet element located in front of the sensor element, no magnetic flux acts on the sensor element. An embodiment of the present invention of this type offers the advantage of the presence of additional data in the sensor signal, indicating that there is no magnetization of the magnet element in the measurement range of the sensor element. In contrast to conventional approaches, in which it is not possible to detect a state in which there is no magnetization, it is possible in this manner to obtain detailed information regarding the state of the magnetization of the magnet element in the measurement range of the sensor element.

The sensor element can also, according to another embodiment of the present invention, be designed such that it can provide a sensor signal having a sensor signal value, from which the orientation of a magnetic field at the region of the magnet element located in the measurement range of the sensor element can be detected, but not, however, a strength of the magnetic field at the region of the magnet element located in the measurement range of the sensor element. An embodiment of the present invention of this type offers the advantage that only the indication of a detected magnetic field is regarded as relevant, by means of which the potential number of signal sensor values is reduced, such that a processing of the sensor signals is simplified.

In order to obtain the most meaningful data regarding the relative position of the magnet element in relation to the sensor element, the sensor device can have at least one additional sensor element, in particular an additional Hall sensor element, wherein the additional sensor element is designed to be able to issue an additional sensor signal, which represents a state with respect to a magnetization of a region of the magnet element located in the measurement range of the additional sensor element by means of one of at least three pre-defined sensor signal values. In this manner, a sensor signal code word can be identified from the signal values of the sensor signal and the additional sensor signals, which provides a more reliable statement, regarding the relative position of the magnet element in relation to the sensor element, than the data that is only contained in the sensor signal value of a single sensor element.

Particularly advantageous, moreover, is an embodiment of the invention, in which a signal output unit is provided, which is designed to be able to link the sensor signal value of the sensor signal from the sensor element with at least the sensor signal value of the additional sensor signal of the at least one additional sensor element, to create a sensor signal word. Wherein the signal output unit is also designed to be able to issue sensor signal words for different relative positions of the magnet element in front of the sensor element and the additional sensor element, which exhibit a Hamming spacing of at least two, in particular, a Hamming spacing of at least three. An embodiment of the present invention of this type offers the advantage that a distinctness of the individual sensor signal words is increased.

In order to enable a very good distinctness of the states of the magnetization of the magnetic field in the measurement range of the sensor element, the magnet element can have a special design. In particular, the magnet element may, according to one embodiment of the present invention, have at least one hole and/or recess between two magnetized regions, in particular, wherein the hole and/or recess represents a state, with respect to a magnetization of a region of the magnet element, in which there is no magnetization. As a result of the provision of the hole and/or recess, it is possible, in contrast to approaches in the prior art, to ensure a particularly good, and readily identified, transition between two differently or identically magnetized regions of the magnet element.

A further improvement of the distinctness between two differently or identically magnetized regions of the magnet element can be implemented according to one embodiment of the present invention, if a diamagnetic material, in particular copper, is disposed in the hole and/or recess. The incorporation of a diamagnetic material of this type enables the "extraction" of magnetic field lines in the regions exhibiting the diamagnetic material. In the case in which a diamagnetic material is disposed in the measurement range of the sensor element, it is thus possible to even better, and more clearly, detect the presence of a region having a non-magnetized state of the magnet element.

In order to be able to produce a particularly simple magnet element, the magnet element can have numerous sub-elements, wherein one, at least in part planar, carrier element is provided, on which the magnetic sub-elements are disposed. A, at least in part planar, carrier element can, for example, be a carrier plate, on which the individual magnetic sub-elements are attached, or inserted. Magnetic sub-elements can, for example, be permanent magnets thereby, which are glued onto the carrier plate, or inserted in the planar carrier element as a separate element, and are braced by the carrier plate, or otherwise connected thereto such that they cannot move.

According to one advantageous embodiment of the present invention, a sensor testing unit can be provided, which is designed to be able to change a direction of a current flow through the sensor element, and to detect a correct functioning of the sensor element on the basis of a sensor signal value of a sensor signal detected according to the changed current flow through the sensor element. An embodiment of the present invention of this type offers the possibility that the sensor device enables a separate internal testing of its functionality, such that a malfunctioning sensor device can be readily detected, and quickly replaced.

In a particularly advantageous manner, the present invention can be used in conjunction with the determination of a shifting position of a shift lever for the gear selection of a vehicle. According to a special embodiment of the present invention, a shifting device, in particular for a motor vehicle, can thus be provided, wherein a sensor device is used, as described above in one variation, wherein the sensor device is designed to be able to detect a position of a shifting lever, in particular a gearshift lever.

Figure 3:
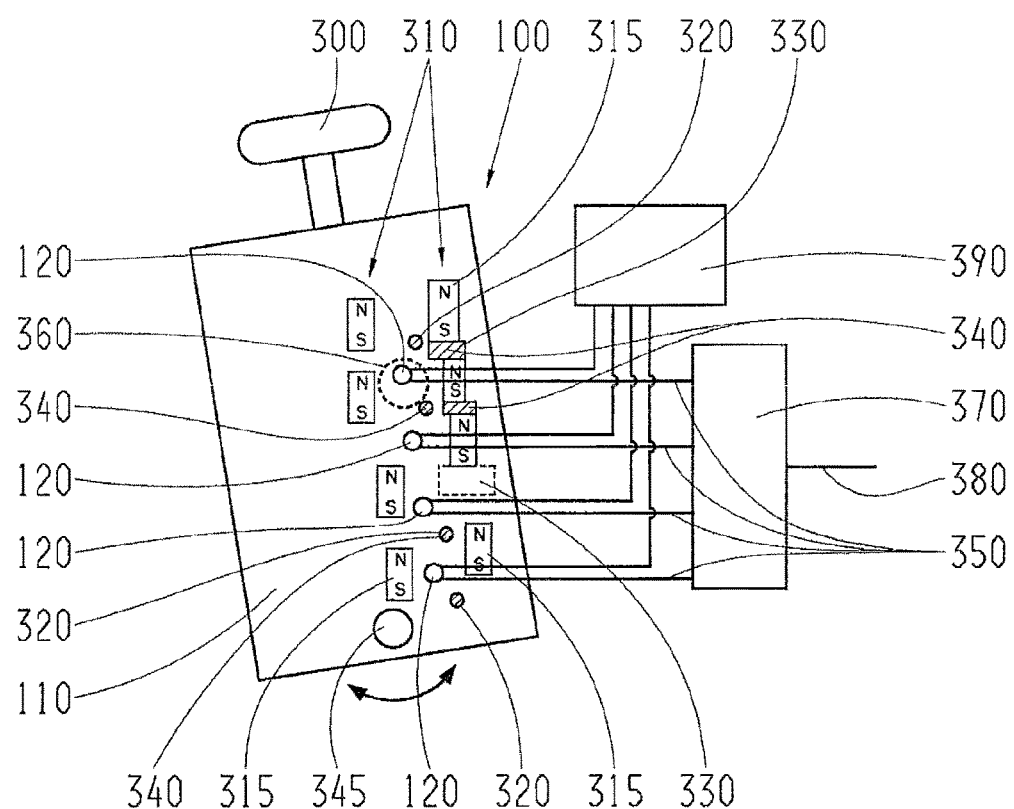
Figure 9:
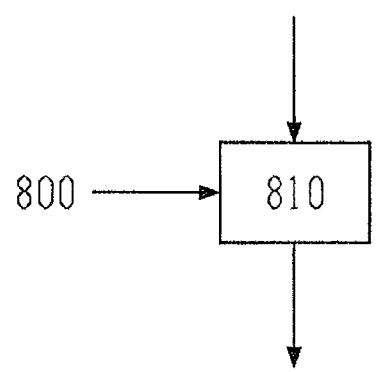

The invention shall be explained in greater detail based on the attached drawings. Shown are:

FIG. 1 an example for an application of a sensor device according to the prior art;

FIG. 2 a table, showing a binary shifting behavior of code words from 4 sensor signal values having a Hamming spacing of two;

FIG. 3 a block diagram of one embodiment example in the form of a sensor device;

FIG. 4A a schematic top view of a magnet element according to one embodiment example;

FIG. 4B a table, showing a ternary shifting behavior, based on code words from four sensor signal values that can be generated, of the embodiment example shown in FIG. 4A;

FIG. 5A a first schematic diagram for clarification of the formation of the Hall voltage by means of an external magnetic field;

FIG. 5B a second schematic diagram for clarification of the formation of the Hall voltage by means of an external magnetic field;

FIG. 6 a table, reproducing an example pattern for a Hamming distance $h_{min}=3$, with the use of a ternary sensor;

FIG. 7 a table, in which a comparison of the yields from different code words with different types of sensors is illustrated;

FIG. 8 a table, in which a number of sensors are depicted, which can be reduced with a conversion from binary to ternary sensors;

FIG. 9 a flow chart for one embodiment example, in the form of a method.

In the following description of preferred embodiment examples the same or similar reference symbols are used for the elements depicted and having similar functions in the different figures, wherein there shall not be a repeated description of these elements.

In FIG. 3, a block diagram for an embodiment example in the form of a sensor device 100 is depicted. The sensor device 100 is disposed, by way of example, on a gearshift lever 300 for an automatic transmission, and comprises at least one magnet element 110, on which differently magnetized regions 310 are present. These differently magnetized regions can be formed, by way of example, by permanent magnets 315, which are embedded in the magnet element 110, or are glued onto the magnet element 110. Moreover, holes 320 and/or recesses 330 (i.e. recesses in a carrier plate of the magnet 110) can also be incorporated in the magnet element 110. Alternatively, or additionally, a diamagnetic material 340 can be incorporated in these holes 320 and/or recesses 330, in order to obtain a concentration of the magnetic field into the regions of the magnet element 110 not filled with a diamagnetic material 340. Furthermore, the sensor device 100 comprises at least one sensor element 120, presently four sensor elements 120, each of which is designed to be able to issue a sensor signal 350, which represents a state, with respect to a magnetization of a region of the magnet element 110 located in the measurement range 360 of the sensor element 120, by means of one of at least three pre-defined sensor signal values. The magnet element 110 is disposed thereby, such that it can move about a point of rotation 345 in relation to the sensor elements 120, and is disposed such that it cannot move in relation to the gearshift lever 300, in order to be able, after a movement of the gearshift lever 300, to detect a position of the magnet element 110 by means of the sensor element 120, and consequently, to be able to detect a position of the gearshift lever 300. The sensor signals 350 are linked to a code word in the form of an output signal, in a sensor output unit 370, as shall be explained in greater detail below. In addition, the sensor device 110 can have a testing unit 390, which is designed to be able to test the functionality of the sensor element, for example, in accordance with the following description.

A schematic top view of a magnet element 110 according to one embodiment example is shown in FIG. 4A. In FIG. 4B, a table is shown, which depicts the shifting behavior that can be allocated to this preferred embodiment example. The magnet element 110 can be used thereby in a sensor device, for example, such as the sensor device 110 described above. The magnet element 110 is formed by a rectangular magnet plate, which can be moved back and forth, parallel to at least one direction (the arrow direction depicted in FIG. 4A). The magnetic field plate 110 comprises numerous magnetized regions 310 and non-magnetized regions 320, 330 340. The magnetized regions 310 comprise differently magnetized regions, or magnetized regions having different polarities. The configuration of magnetized and non-magnetized regions, as well as the magnetized regions having different polarities shown in FIG. 4A is only selected by way of example, and can be configured differently. In detail, the magnet plate 110 in the embodiment shown by way of example comprises numerous magnetic north poles, which are represented by the fields in FIG. 4A that have a simple hatching. Furthermore, the magnet plate 110 comprises numerous regions that have a cross-hatching, representing a magnetic south pole. The un-shaded regions correspond to non-magnetized regions, which are realized in this preferred embodiment, by way of example, by means of a combination of a hole 320, a recess 330, and a diamagnetic material 340. The magnet plate 110 can, as a rule, comprise non-magnetized regions, which can be formed by just a hole 320, just a recess 330, or just a diamagnetic material, or by an arbitrary combination thereof. The non-magnetized region results, in this preferred embodiment example, in a signal sensor state "0," the magnetic north pole results in a sensor signal state "1," and the magnetic south pole results in a sensor signal state "2." In the following, the respective sensor signal states that can be generated shall be explained in detail, in reference to the FIGS. 5A-5B.

From the pattern, or configuration, respectively, of the magnetized and non-magnetized regions shown in FIG. 4A, in conjunction with the allocation thereof, described above, the table shown in FIG. 4B is obtained, having the corresponding shifting pattern allocated thereto. The shifting pattern is generated by means of an interaction of the magnet plate 110 with numerous sensor elements 120, in this case four ternary sensor elements 120. The magnet plate 110 interacts with the ternary sensor elements 120 such that the magnet plate 110 can move in relation to the sensor elements 120, wherein the magnet plate 110 can pass over the sensor elements 120 such that it activates signals, or can be passed over by the sensor elements such that signals are activated, wherein the sensor elements 120 issue a sensor signal, when in the passing over state, which represents a state with respect to a magnetization of a region of the magnet plate 110 located in the measurement range of the sensor element 120 by means of one of at least three pre-defined sensor signal values. The sensor signals are linked to code words in the form of an output signal in a sensor output unit, as shown in FIG. 4B.

One solution known of so far consists of increasing the Hamming distance by means of using more sensors, e.g. seven sensors, instead of only four. The presently proposed approach represents an alternative solution, based on the Hall effect and the minimal structure of a Hall sensor. For this, the functioning of a Hall sensor should first be sketched out.

FIG. 5 shows the basis for the Hall effect in two sub-figures, 5A and 5B. The Hall voltage arises from an electron current e, caused by a magnetic field, and built up transverse to the flow direction of the current I. In FIG. 5A, the magnetic field is oriented in the opposite direction to that in FIG. 5B. The algebraic sign for the voltage is dependent on the direction of the magnetic field and the current. If one constructively provides the direction of current in the configuration shown by way of example in FIG. 5, then the magnetic field B remains as the only variable for detecting the position of the shift lever (as shown in FIG. 1), if the assembly shown in FIG. 5 is incorporated in a sensor for detecting the position of the gearshift lever. The field direction is constructively implemented by means of the selection of the magnetized zones on the magnet plate.

In principle, it is thus possible to output three states with a Hall sensor, the analog signal of which (in this case, by way of example, described by the sine function sin(x)) is quantized. By way of example, with a Hall voltage $U_{Hall}>0$, a value $sin(U_{Hall})=+1$ can be obtained, which indicates that a magnet faces a direction on the Hall sensor, such that the available voltage is positive, and is located in the proximity of the positive maximal Hall voltage. In the case in which a Hall voltage of $U_{Hall} \approx 0$ has been detected, an algebraic sign of $U_{Hall}=0$ is obtained, which can be interpreted to mean that no magnet has been applied to the Hall sensor, thus, practically no magnetic flux and no Hall voltage are present. Because of stray fields from the magnet plate, environmental influences, and the earth's magnetic field, small values are also to be defined as $U_{Hall}=0$. In the case where $U_{Hall}<0$ has been measured, the algebraic sign for $U_{Hall}$ is defined as $sin(U_{Hall})=-1$, which can be interpreted to mean that a magnet on the Hall sensor, with respect to the previously specified orientation, is oriented in the other direction. The voltage in this case is negative, and lies in the proximity of the negative maximal Hall voltage. A (Hall) sensor of this type, having three states, can also be referred to as a ternary sensor.

The approach, described in greater detail below, is based on numerous modification proposals to the prior art. By way of example, the Hall sensor can be operated in its "natural" capacity, in which it represents the direction of the magnetic field via the algebraic sign for the voltage. Moreover, the signal processing of the Hall voltage can be translated, according to the determination of voltage ranges for the Hall voltage, as 00 (no magnetic field), 01 (flow direction A), 10 (flow direction opposite to A) and optionally 11 (sensor reports an error). Furthermore, a magnet plate (such as that depicted in FIG. 1 or FIG. 3) can be perforated during or after the production, in order to be able to depict the state 00 in conjunction with the Hall sensor. The particular advantage of the shifting pattern thus lies in that, with the same number of sensors, a greater Hamming distance can be generated.

As a technical advantage of the approach presented here, firstly, a technically very simple evaluation of the selection lever position can be obtained. For this, it is possible to implement a total of 16 code words with two states for each sensor. If more than just two different code words for each shifting position are necessary, thus, for example, six code words for the six positions P, R, N, D, +, and −, then the development should be limited to a Hamming distance of two. The table in FIG. 2 shows that for four sensors, there are two chains of codes for each, each having eight code words, which maintain a Hamming distance among themselves of at least two.

If one replaces the binary Hall sensors with the ternary Hall sensors from this proposal, the algebraic sign for the voltage can be depicted, according to the approach described above, using the sign function, by means of the substitution:

$$b_i = sin(U_{Hall}) + 1$$

where
$b_i$=value of the $i^{th}$ bit (without unit)
$U_{Hall}$=measured Hall voltage in the unit volt
i.e. the alphabet for the code word is translated from the sensor states −1, 0, 1, to 0, 1, 2, in order to simplify the calculation of the sensor state during the design phase of a shifting pattern.

With four "bits" (i.e. actually, positions of a code word), which can each assume three states (corresponding to the signals of a ternary sensor), then it is possible to form $3^4=81$ code words, thus, more than five times that with only two states. With the calculation of the possible Hamming chains, it is shown that with four sensors, and three states each, 72 different chains are obtained, having a Hamming spacing of three as depicted in the table in FIG. 2, a binary sensor can only provide two chains.

The table in FIG. 6 shows example patterns for Hamming chains having a Hamming distance of $h_{min}=3$ when using a ternary sensor. In particular, the example shows a Hamming chain 0000-0111-0222-1012-1120-1201-2021-2102-2210, in which each code word has a Hamming spacing of exactly three from each of the others.

The table in FIG. 7 shows a comparison of the possibilities a ternary sensor offers (i.e. providing the three states 0/1/2) with respect to a binary sensor (i.e. providing the two states 0/1), wherein, in the first column, the number A of sensors is given, in the second column, the minimum required Hamming distance $d_{min}$ is given, in the third column, the chain length $K_b$, and the number $A_b$ in the case of a binary sensor, is given, and in the fourth column, the chain length $K_t$ and the number $A_t$ in the case of a ternary sensor, is given. The table in FIG. 7 thus shows a comparison of the yields with different types of sensors. The longer the chain length, the greater the number of different shifting commands (P, R, N, D, +, −, etc.) that can be assigned to a code word, while at the same time obtaining the required and advantageous minimal Hamming distance.

Alternatively, the table in FIG. 7 also provides an overview of how the number of sensors can be reduced, while maintaining the same performance of the sensor system. Because a sensor system having three states for each sensor provides more different code words than a sensor system having only two states for each sensor, the number of sensors can be reduced, while maintaining the same functionality and unchanged usage, for safety and availability.

The reduction is calculated according to the equation $$k \geq n \cdot \frac{\ln 2}{\ln 3}$$

where
k=the number of required ternary sensors (having three states), and
n=the number of available binary sensors (having two states)

In the table in FIG. 8, a result is shown in which the number of sensors that can be eliminated when converting from binary to ternary sensors is depicted, wherein, in the upper line, the number of sensors for the old layout with binary signals $2_n$ is listed, and in the lower line, the number of required sensors when using the new layout is listed, i.e. of the sensors, having $3^k$ different states for each sensor value, that are required in order to obtain a code word space that corresponds to the code word space with the use of binary sensors.

A further technical advantage of the approach proposed here can be seen in the possibility of providing a better diagnosis. A further, frequently stipulated, requirement is the permanent diagnosis of the system. With sensors having three states, a further possibility is provided for executing the diagnosis: if there is a pole ("magnetic north" or "magnetic south") over the sensor, the sensor can be checked, for example, to see if the constructive, given flow direction I (for example, as can be seen in the sub-figures in FIG. 5) has been shut off, and then reversed, for the diagnosis. A properly functioning sensor is then obtained in that, first, the Hall voltage disappears, and is then again present at the sensor with the opposite algebraic sign. In the case that, with the reversal of the current flow, no sensor results behavior of this type can be observed, it can then be concluded that the sensor in question is defective.

As a further technical advantage, a special magnet plate can be specified, which can be used to support the functionality of the approach presented here. This magnet plate, as it is depicted, by way of example, in FIGS. 1 and 4A, can, for example, depict the state "00," in which there is no magnetic field, by means of perforations in conjunction with the Hall sensor positioned in front of the perforation. In order to assemble particularly compact magnet plates, or in order to obtain a particularly clear transition between magnetic and non-magnetic regions, the holes in the plates can be furnished with a diamagnetic insert ($\mu_r < 1$, e.g. copper). Alternatively, the magnet plate can be composed of individual pieces or magnets, which in turn, are placed on a carrier plate. If the sensors are only attached to one side, then there is no disadvantage with this configuration if a continuous sheet is used, onto which the magnetic pieces are glued over a large area.

The implementation of the approach presented here provides a series of advantages. On one hand, it is possible to undertake a constructive reworking of existing sensor systems, in which the binary sensors can be replaced with ternary sensors, and can be combined with a magnet plate having three states, "magnetic north," "magnetic south," and "non-magnetic." As a result, a utility is obtained with the same number of sensors because, in a conflict of the objectives in consideration of an evaluation certainty of the sensor results as compared with an availability of the sensor results, the sensor system that is to be produced can be better tailored to the requirements of a customer, in that either a higher security level is obtained, or the availability is improved (SIL/ASIL). As a further utility, it may be mentioned that with the reworking of existing solutions, no change to the packaging is necessary (i.e. the configuration of the sensors in a sensor housing), and it is possible to retain numerous components with very little effort in terms of adapting them. Alternatively, the number of sensors can be reduced, while retaining the same level of security/availability.

Moreover, the present approach provides a diagnostic advantage, because it provides a further possibility for immediately checking the sensor in terms of its correct functioning.

Regarding the special magnet plate, it should be noted that the combining of individual magnets or pieces of magnet plates on a carrier sheet can improve the freedom in terms of the design of the magnet plate (i.e. configuration and dimensions of the individual poles), and lower costs and processing times in the production of the magnet plate.

FIG. 9 shows a flow chart for one embodiment example as a method 800 for detecting a position of the magnet element in relation to a sensor element, wherein the method 800 uses a sensor device corresponding to an embodiment example described above. The method 800 comprises a step 810 for issuing a sensor signal that represents a state with respect to a magnetization of a region of the magnet element located in the measurement range of the sensor element by means of one of at least three pre-defined sensor signal values.

In summary, the most important features of the approach presented here shall be highlighted once again in the following. First, the use of one or more ternary sensors is proposed, for detecting the position of the gearshift lever. A shifting device, in particular for motor vehicles, has a magnetic device thereby, having one or more regions that can exhibit a magnetization, and a sensor that can identify magnetization that is present, and that can determine the direction of this magnetization. The magnet plate can, conveniently, be combined thereby, on one side, with a combination of at least one of the three possible states, "magnetic north," "magnetic south," and "not magnetized." At the same time, the non-magnetized regions can be implemented in this magnet plate by means of holes. For checking the correct functionality of a sensor of this type, a device may be provided, which can check the functionality of the Hall sensor by reversing the current flow in the Hall sensor.

According to another aspect of the present invention, a magnet plate is provided, which exhibits three states for attaching sensors on one side thereof, specifically, the state "magnetic north," the state "magnetic south," and the state "hole" (i.e. that in this state, no magnetic field can be detected by the sensor). In a special form, the magnet plate can contain a diamagnetic insert in the holes, in order to shield the magnetic regions such that their stray magnetic fields are weakened in the non-magnetized zones, or forced out of them. Alternatively, or in addition thereto, the magnet plate can be made out not just one piece, but rather, the components thereof can be held together by means of a carrier, in particular, a molded sheet, or attached thereto, wherein the non-magnetic regions can be implemented as holes in the carrier. In this case as well, the magnet plate can be provided with diamagnetic inserts in the holes, or in the intermediate spaces between the individual magnetic components of the magnet plate, respectively.

The embodiment examples that have been described and shown in the figures are selected merely as examples. Different embodiment examples can be combined with one another, either entirely, or with respect to individual features. Moreover, an embodiment example can be supplemented with features from another embodiment example.

Furthermore, method steps according to the invention can be executed repeatedly, or in a sequence other than that described.

If an embodiment example comprises an "and/or" conjunction between a first feature and a second feature, then this can be read to mean that the embodiment example according to one design exhibits both the first feature and the second feature, and according to another design, exhibits either only the first feature, or only the second feature.

REFERENCE SYMBOLS

100 sensor device
110 magnet plate, magnet element
120 sensor element
300 gearshift lever, selection lever 310 magnetized regions of the magnet element
315 permanent magnet
320 hole
330 recess
340 diamagnetic material
345 point of rotation
350 sensor signals, sensor signal lines
360 measurement range
370 output unit
380 code word, output signal
390 testing unit
800 method for detecting a position of the magnet element in relation to a sensor element
810 output step
$U_H$ Hall voltage
B magnetic field
e electron flux
I current flow

The invention claimed is:

1. A sensor device comprising:
at least one sensor element, and
at least one magnet element that can move in relation to the at least one sensor element, wherein the at least one magnet element includes a plurality of differently magnetized regions,
wherein the sensor element is configured to issue a sensor signal that represents a condition determined by a magnetization of a region of the magnet element located in the measurement range of the sensor element,
wherein the sensor element determines the condition by means of one of at least three pre-defined sensor signal values,
at least one additional sensor element, wherein the additional sensor element is configured to issue an additional sensor signal that represents a condition determined by a magnetization of a region of the magnet element located in the measurement range of the additional sensor element, wherein the additional sensor element determines the condition by means of one of at least three pre-defined sensor signal values,
a signal output unit, which is configured to link the sensor signal value of the sensor signal from the sensor element with at least the sensor signal value of the additional sensor signal of the at least one additional sensor element to form a sensor signal word, wherein the signal output unit is further configured to output sensor signal words for different relative positions of the magnet element in relation to the sensor element and the additional sensor element, wherein sensor signal words have a Hamming spacing of at least two.

2. The sensor device according to claim 1, wherein the sensor element is configured to provide a pre-defined sensor signal value as a sensor signal when no magnetic flux acts on the sensor element.

3. The sensor device according to claim 1, wherein the sensor element is configured to provide a sensor signal having a sensor signal value, wherein the sensor signal value identifies the orientation of a magnetic field at the region of the magnet element located in the measurement range of the sensor element, wherein a strength of the magnetic field at the region of the magnet element located in the measurement range of the sensor element is not identified.

4. The sensor device according to claim 1, wherein the magnet element has a non-magnetized region between two magnetized regions.

5. The sensor device according to claim 4, wherein a diamagnetic material is disposed in the non-magnetized region.

6. The sensor device according to claim 5, wherein the diamagnetic material comprises copper.

7. The sensor device according to claim 4, wherein the magnet element includes at least one sub-element, further comprising a carrier element on which the at least one sub-element is disposed.

8. The sensor device according to claim 1, further comprising a sensor testing unit which is configured to change a direction of a current flow through the sensor element and to identify a correct functioning of the sensor element on the basis of a sensor signal value of a detected sensor signal according to the changed current flow through the sensor element.

9. The sensor device according to claim 1, wherein the at least one sensor element is a Hall sensor element.

10. The sensor device according to claim 1, wherein the magnet element has a hole between two magnetized regions.

11. The sensor device according to claim 1, wherein the magnet element has a recess between two magnetized regions.

12. A shifting device comprising:
a shifting lever, and
a sensor device comprising:
at least one sensor element, and
at least one magnet element that can move in relation to the at least one sensor element, wherein the at least one magnet element includes a plurality of differently magnetized regions,
at least one additional sensor element, wherein the additional sensor element is configured to issue an additional sensor signal that represents a condition determined by a magnetization of a region of the magnet element located in the measurement range of the additional sensor element, wherein the additional sensor element determines the condition by means of one of at least three pre-defined sensor signal values,
a signal output unit, which is configured to link the sensor signal value of the sensor signal from the sensor element with at least the sensor signal value of the additional sensor signal of the at least one additional sensor element to form a sensor signal word, wherein the signal output unit is further configured to output sensor signal words for different relative positions of the magnet element in relation to the sensor element and the additional sensor element, wherein sensor signal words have a Hamming spacing of at least two,
wherein the sensor element is configured to issue a sensor signal that represents a condition determined by a magnetization of a region of the magnet element located in the measurement range of the sensor element,
wherein the sensor element determines the condition by means of one of at least three pre-defined sensor signal values,
wherein the sensor device is configured to detect a position of the shifting lever.

* * * * *